US012231847B2

(12) United States Patent
LaColle et al.

(10) Patent No.: US 12,231,847 B2
(45) Date of Patent: Feb. 18, 2025

(54) OPTICAL MICROPHONE ASSEMBLY (71) Applicant: SensiBel AS, Oslo (NO)

(72) Inventors: Matthieu LaColle, Nesøya (NO); Håkon Sagberg, Oslo (NO); Jakob Vennerød, Oslo (NO)

(73) Assignee: Sensibel AS, Oslo (NO)

(*) Notice: Subject to any disclaimer, the term of this patent is extended or adjusted under 35 U.S.C. 154(b) by 268 days.

(21) Appl. No.: 17/441,947

(22) PCT Filed: Mar. 20, 2020

(86) PCT No.: PCT/GB2020/050765
§ 371 (c)(1),
(2) Date: Sep. 22, 2021

(87) PCT Pub. No.: WO2020/193962
PCT Pub. Date: Oct. 1, 2020

(65) Prior Publication Data
US 2022/0167096 A1 May 26, 2022

(30) Foreign Application Priority Data
Mar. 22, 2019 (GB) .................................. 1904005

(51) Int. Cl.
H04R 23/00 (2006.01)
B81B 3/00 (2006.01)
H04R 1/02 (2006.01)

(52) U.S. Cl.
CPC ......... H04R 23/008 (2013.01); B81B 3/0029 (2013.01); H04R 1/02 (2013.01); B81B 2201/0257 (2013.01); H04R 2201/003 (2013.01)

(58) Field of Classification Search
CPC .......... H04R 1/288; H04R 1/025; H04R 3/00; H04R 1/023; H04R 19/02;
(Continued)

(56) References Cited

U.S. PATENT DOCUMENTS 4,533,795 A   8/1985 Baumhauer, Jr. et al.
7,355,720 B1  4/2008 Carr
              (Continued)

FOREIGN PATENT DOCUMENTS

CN   203407016 U   1/2014
CN   104113808 A   10/2014
              (Continued)

OTHER PUBLICATIONS

International Search Report; European Patent Office; International Application No. PCT/GB2020/050765; Jun. 16, 2020; 4 pages.
(Continued)

Primary Examiner — Carolyn R Edwards
Assistant Examiner — Julie X Dang
(74) Attorney, Agent, or Firm — Taft Stettinius & Hollister LLP (57) ABSTRACT An optical microphone assembly including a micro-electro-mechanical system (MEMS) component, a semiconductor chip, and an outer housing including at least part of a non-MEMS supporting structure and defining an aperture. The MEMS component includes an interferometric arrangement which includes a membrane and at least one optical element spaced from the membrane. The semiconductor chip includes at least one photo detector and a light source. The MEMS component is mounted on the non-MEMS supporting structure and sealed to the outer housing such that the MEMS component closes the aperture. The semiconductor chip is mounted separately from the MEMS component on the non-MEMS supporting structure in a spaced relationship with the MEMS component such that the MEMS component is displaced relative to the semiconductor chip in a direction perpendicular to a reflecting surface of the membrane. The light source is arranged to provide light to the interferometric arrangement such that a first portion of
(Continued)

the light propagates along a first optical path via the interferometric arrangement, and a second portion of the light propagates along a second, different optical path via the interferometric arrangement such that at least one of the first and second portions is reflected by the reflecting surface of the membrane, thereby giving rise to an optical path difference between the first and second optical paths which depends on a distance between the membrane and the optical element. The at least one photo detector is arranged to detect at least part of an interference pattern generated by the first and second portions of light dependent on the optical path difference.

17 Claims, 9 Drawing Sheets

(58) Field of Classification Search
CPC .. H04R 2201/003; H04R 19/04; H04R 17/02; H04R 19/005; H04R 23/02; H04R 23/008; H04R 31/003; H04R 2307/207; H04R 7/18; H04R 23/006
USPC .................. 381/91, 112, 356, 172, 175, 181
See application file for complete search history.

(56) References Cited

U.S. PATENT DOCUMENTS

| | | | |
|---|---|---|---|
| 9,485,560 B2* | 11/2016 | Vos | H04R 19/005 |
| 2002/0039463 A1 | 4/2002 | Degertekin et al. | |
| 2004/0130728 A1 | 7/2004 | Degertekin et al. | |
| 2005/0018541 A1 | 1/2005 | Johansen et al. | |
| 2005/0105098 A1 | 5/2005 | Johansen et al. | |
| 2006/0192976 A1 | 8/2006 | Hall et al. | |
| 2006/0227845 A1 | 10/2006 | Degertekin et al. | |
| 2007/0165896 A1* | 7/2007 | Miles | H04R 23/006 381/356 |
| 2012/0093346 A1 | 4/2012 | Feiertag et al. | |
| 2013/0140655 A1* | 6/2013 | Yeh | H04R 31/006 438/51 |
| 2014/0314254 A1 | 10/2014 | Conti et al. | |
| 2015/0054098 A1 | 2/2015 | Ravnkilde | |
| 2015/0257898 A1* | 9/2015 | Weiland | A61F 2/4611 623/17.16 |
| 2015/0365770 A1* | 12/2015 | Lautenschlager | H04R 19/005 381/172 |
| 2015/0373446 A1* | 12/2015 | Chen | B81B 7/0032 381/111 |
| 2016/0007108 A1* | 1/2016 | Lee | H04R 1/08 381/111 |
| 2016/0007125 A1* | 1/2016 | Lee | H04R 31/003 29/896.2 |
| 2016/0107884 A1* | 4/2016 | Formosa | B81B 7/0061 381/113 |
| 2016/0219374 A1* | 7/2016 | Hall | H04R 17/02 |
| 2018/0070158 A1* | 3/2018 | Watson | H04R 17/00 |
| 2019/0047847 A1* | 2/2019 | Khenkin | H04R 19/005 |

FOREIGN PATENT DOCUMENTS

| | | |
|---|---|---|
| CN | 104244154 A | 12/2014 |
| CN | 104780474 A | 7/2015 |
| CN | 107690102 A | 2/2018 |
| CN | 108696812 A | 10/2018 |
| KR | 101684526 B1 | 12/2016 |
| WO | 2010029509 A1 | 3/2010 |
| WO | 2014202753 A1 | 12/2014 |

OTHER PUBLICATIONS

Written Opinion of the International Searching Authority; European Patent Office; International Application No. PCT/GB2020/050765; Jun. 16, 2020; 14 pages.

Donghwan Kim et al.; Towards a Sub 15-dBA Optical Micromachined Microphone; J. Acoust. Soc. Am.; May 2014; 10 pages; vol. 135, No. 5.

Yu Yuanyuan et al.; AlN MEMS Microspeakers with High Compressive Stress; Chinese Journal of Sensors and Actuators; Aug. 2018; 7 pages; vol. 31 No. 8.

Chinese Office Action; China National Intellectual Property Administration; Chinese Patent Application No. 202080034945.9; Nov. 22, 2023; 11 pages.

Japanese Office Action; Japanese Patent Office; Patent Application No. 2021-559459; Apr. 30, 2024; 17 pages.

* cited by examiner

Fig. 4

OPTICAL MICROPHONE ASSEMBLY

CROSS REFERENCE TO RELATED APPLICATIONS

This application is a U.S. national stage filing of International Patent Application No. PCT/GB2020/050765 filed Mar. 20, 2020, which claims priority to United Kingdom Patent Application No. 1904005.4 filed Mar. 22, 2019, the contents of each application hereby incorporated by reference in their entirety.

This invention relates generally to optical microphone assemblies, and in particular to housing structures for optical microphones.

Microphones are used to convert sound waves into electrical signals, typically by measuring the displacement of a moveable member (e.g. a membrane) that vibrates in response to ambient acoustic vibrations. There are a number of ways of measuring the displacement of such a moveable member, including capacitive readout (commonly called condenser microphones) and electrostatic or electromagnetic readout mechanisms (e.g. dynamic microphones).

An alternative way of reading out the position of a microphone membrane is optical interferometric read out. In typical examples of such systems, a diffraction grating is provided adjacent to a membrane, and electromagnetic radiation is directed onto the diffraction grating. A first portion of the light is reflected back from the grating. A second portion is transmitted through the grating, which diffracts the radiation. The diffracted radiation impinges on the membrane, which reflects it onto the grating. The radiation passes through the grating and the two portions of light interfere to create an interference pattern that can be detected by a detector. The interference pattern has a shape (i.e. spatial distribution) matching the diffraction orders of the grating, but the light intensity directed into these diffraction orders depends on the relative phase of the two portions of light, and therefore on the distance between the grating and the membrane. The position (and therefore the movement) of the membrane can thus be determined from changes in the intensity of the light at the detector.

Due to the length scales of the components of such systems, optical microphones are typically fabricated as micro-electromechanical systems (MEMS) components. In such systems, the MEMS component comprises a light source and one or more detectors, along with a membrane and a grating positioned relative to the source and the detector so as to generate the required interference pattern.

The MEMS component is typically mounted inside a housing with an acoustic port to allow the sound waves to enter the housing. One side of the membrane is in fluid communication with the exterior of the housing via the acoustic port, while the other side of the membrane is in fluid communication with an enclosed acoustic cavity (commonly referred to as a back volume) inside the housing. An incoming acoustic wave then exerts a force only on the side of the membrane in fluid communication with the exterior, creating a pressure differential causing the membrane to vibrate.

Such microphones have a high signal to noise ratio (SNR) and high sensitivity. However, further improvements in the performance of such microphones are desirable.

When viewed from a first aspect the invention provides an optical microphone assembly comprising:
a micro-electromechanical system (MEMS) component comprising an interferometric arrangement, the interferometric arrangement comprising a membrane and at least one optical element spaced from the membrane;
a semiconductor chip comprising at least one photo detector;
a light source mounted on or integrated in the semiconductor chip;
a non-MEMS supporting structure; and
an outer housing including at least part of the non-MEMS supporting structure, the outer housing defining an aperture;
wherein the MEMS component is mounted on the non-MEMS supporting structure and sealed to the outer housing such that the MEMS component closes the aperture;
wherein the semiconductor chip is mounted separately from the MEMS component on the non-MEMS supporting structure in a spaced relationship with the MEMS component such that the MEMS component is displaced relative to the semiconductor chip in a direction perpendicular to a reflecting surface of the membrane;
wherein the light source is arranged to provide light to the interferometric arrangement such that a first portion of said light propagates along a first optical path via said interferometric arrangement and a second portion of said light propagates along a second, different optical path via said interferometric arrangement such that at least one of said first and second portions is reflected by the reflecting surface of the membrane, thereby giving rise to an optical path difference between the first and second optical paths which depends on a distance between the membrane and the optical element; and
wherein the at least one photo detector is arranged to detect at least part of an interference pattern generated by said first and second portions of light dependent on said optical path difference.

Thus in accordance with at least embodiments of the invention, the MEMS component is positioned so that it creates a "back volume" acoustic cavity on one side of the membrane, but does not create a "front volume" acoustic cavity between the aperture and the side of the membrane that is in fluid communication with the exterior of the microphone.

The Applicant has appreciated that such a configuration is advantageous because it provides an improved frequency response. In arrangements according to the prior art as described above, a front volume acoustic cavity is created between the acoustic port and the membrane of the MEMS component, which is mounted in a housing. The Applicant has appreciated that the shape of the acoustic cavity and the acoustic port creates artefacts (e.g. peaks) in the frequency response of the microphone, especially at high frequencies (e.g. around 20 kHz). This is undesirable, particularly for microphone applications using those high frequencies. Embodiments of the present invention may thus advantageously provide a high signal-to-noise ratio as well as a flat frequency response. For example, some embodiments may provide a flat frequency response in the range 20 Hz to 20 kHz, which may be particularly advantageous as it corresponds to the typical range of human hearing.

Embodiments in accordance with the present invention may provide a further advantage, namely improved ease of manufacture. In optical microphones according to the prior art, it can be difficult to fabricate a MEMS component such that a light source and detector are properly aligned with respect to each other and with respect to a membrane and grating in order to generate a suitable interference pattern at the detector. In accordance with the present invention, the light source and photo detector(s) are mounted separately from the MEMS component comprising the membrane, rather than a light source, detector and membrane all being formed within one MEMS component. Mounting the MEMS component on a non-MEMS supporting structure separately from the semiconductor chip may thus advantageously allow the components to be aligned more easily, improving the ease of manufacture of the optical microphone. The present invention may therefore provide a convenient integrated solution, i.e. where the light source is mounted on or integrated in the semiconductor chip, advantageously allowing alignment of the light source via alignment of the semiconductor chip relative to the MEMS component during manufacture. The Applicant has found that embodiments in accordance with the invention may allow alignment of multiple components (namely the membrane and optical element on the MEMS component and the photo detector(s) and light source on the semiconductor chip) to a precision of ±10 µm.

The meaning of the term micro-electromechanical system (MEMS) is well understood by a person skilled in the art, so it will be understood that when a component is described as being a "MEMS component", this means that the component comprises miniaturized mechanical and/or electro-mechanical elements (i.e. devices and structures), for example, which may have been made using microfabrication techniques, where miniaturized means that the physical dimensions of the miniaturized elements are on the scale of micrometres, e.g. up to a millimetre or shorter. It will thus also be understood that a "non-MEMS" structure is a structure that does not meet the definition of "MEMS" as given above.

When it is said that the semiconductor chip comprises at least one photo detector, this may be understood to mean that the at least one photo detector is integrated in the semiconductor chip, e.g. the photo detector(s) may be monolithically integrated in the semiconductor chip e.g. as part of an integrated circuit or optoelectronic circuit. In embodiments where the light source is integrated in the semiconductor chip, it may be monolithically integrated, e.g. as part of an integrated circuit or optoelectronic circuit, e.g. together with the photo detector(s).

In a set of embodiments, the aperture has a width or diameter at least as large as a width or diameter of the membrane. For example, in some embodiments, the width or diameter of the acoustic port is at least 500 µm, or at least 750 µm, or at least 1 mm, or at least 2 mm, or at least 3 mm. In some embodiments, the aperture may be slightly smaller than the membrane, e.g. the aperture may have a width or diameter at least 90% or 95% of a width or diameter of the membrane.

This feature may advantageously reduce restriction of air flow to the membrane surface via the aperture due to the aperture exposing the membrane to the microphone exterior rather than presenting a narrow channel between the membrane and microphone exterior through which air must flow. The Applicant has found that this feature advantageously improves the frequency response of the microphone, particularly at high frequencies.

In a set of embodiments, the aperture is flared such that the aperture has an inner width or diameter adjacent an interior of the optical microphone assembly and an outer width or diameter adjacent an exterior of the optical microphone assembly, wherein the outer width or diameter is larger than the inner width or diameter.

Such embodiments are particularly advantageous as the flared shape of the aperture may reduce restriction of air flow between the exterior of the microphone and the membrane surface. The Applicant has found that this advantageously improves the frequency response of the microphone, in particular at high frequencies. This feature is particularly advantageous when provided in conjunction with an aperture that is at least as large as the membrane. Accordingly, in some embodiments, the inner width or diameter of the flared aperture is at least at large as a width or diameter of the membrane, e.g. at least 1 mm, at least 2 mm, or at least 3 mm. Such embodiments thus provide the advantage that the full area of the membrane can be exposed to the exterior of the microphone, while the flared shape of the aperture further reduces any restriction of air flow between the exterior of the microphone and the membrane surface.

The aperture may be provided with a dust cover. The dust cover may be disposed on the side of the aperture facing the exterior of the optical microphone assembly, or it may be disposed on the side of the aperture facing the interior of optical microphone assembly, i.e. facing the MEMS component.

The dust cover may advantageously reduce the risk of particles or objects external to the microphone accidentally contacting the membrane via the aperture. The dust cover or part of the dust cover may be optically opaque or substantially optically opaque. The dust cover may therefore advantageously reduce leakage of light in or out of the optical microphone assembly via the aperture.

As stated above, the positioning of the MEMS component to close the aperture avoids the creation of a "front volume" acoustic cavity between the aperture and the side of the membrane that is in fluid communication with the exterior of the microphone optical microphone assembly.

It is therefore to be understood that while the dust cover may prevent accidental contact with the membrane and reduce light leakage, it does not significantly impact the acoustic properties of the microphone. In particular, it does not create a "front volume" acoustic cavity between the aperture and the side of the membrane that is in fluid communication with the exterior of the microphone optical microphone assembly. For example, the dust cover may have little or no impact on the resonance frequency of the optical microphone assembly, e.g. it may lower the resonance frequency by no more than 10%, or no more than 5%. The dust cover may comprise holes (e.g. it may be a mesh or porous sheet), wherein the aggregate area of holes is at least 50% of the area of the dust cover. The dust cover may be substantially acoustically transparent. The degree of acoustic transparency may be determined in part by the thickness of dust cover. A sufficiently high acoustic transparency may be achieved by providing a dust cover that is sufficiently thin, e.g. 50 µm, 100 µm or 200 µm. Such thicknesses may be sufficiently thin when provided with adequate perforation to ensure the dust cover is substantially acoustically transparent, as discussed above. The dust cover may be fabricated with the smallest thickness that is practically achievable (which may be constrained, for example, by the material and the fabrication technique used) while ensuring the dust cover is sufficiently structurally robust to prevent accidental contact with the membrane.

The displacement of the MEMS component relative to the semiconductor chip in the direction perpendicular to the reflecting surface of the membrane may be, for example, at least 250 µm, at least 500 µm, at least 1 mm, or at least 2 mm. In this context, the "displacement" of the MEMS component relative to the semiconductor chip refers to the perpendicular distance from the membrane surface to the photo detector(s) on the semiconductor chip. The example displacements given above may advantageously allow convenient alignment of the MEMS component and semiconductor chip. The displacement may be chosen based on the size of the optical element. For example, if the light source has a divergence, the displacement may be chosen such that the width of the light impinging on the optical element substantially matches the width of the optical element.

The optical microphone assembly may comprise more than one chip, e.g. there may be other chips provided in addition to the semiconductor chip discussed above. For example, the optical microphone assembly may comprise an application-specific integrated circuit (ASIC) chip. The ASIC chip may be mounted on the substrate, e.g. adjacent the semiconductor chip so that connections may be provided between the chips. However, it is not essential to have a separate chip for an ASIC. An ASIC may additionally or alternatively be provided (e.g. integrated in) the semiconductor chip and/or the substrate.

The outer housing may be formed from one piece, or it may be formed from separate pieces. For example, the outer housing may comprise a substrate with an enclosure, or a substrate and a superstrate separated by a spacer. Some pieces may be integrally formed, with other pieces attached, e.g. a substrate and spacer may be integrally formed from a single piece, with a separate superstrate attached.

In all arrangements the aperture could be defined in the non-MEMS supporting structure or in another part of the outer housing.

The optical element may be a diffraction grating, but this is not essential. The optical element may be any element that can be used to produce a suitable interference pattern, for example, a diffractive lens or plane reflecting surface.

In a set of embodiments, the non-MEMS supporting structure comprises:
  a substrate;
  a superstrate having the aperture formed therein; and
  a spacer separating the substrate and the superstrate;
wherein the MEMS component is mounted on the superstrate to close the aperture and the semiconductor chip is mounted on the substrate facing the MEMS component.

In a set of embodiments, the non-MEMS supporting structure comprises:
  a substrate having the aperture formed therein;
  a superstrate; and
  a spacer separating the substrate and the superstrate;
wherein the MEMS component is mounted on the substrate to close the aperture and the semiconductor chip is mounted on the superstrate facing the MEMS component.

It is to be understood that the terms 'substrate' and 'superstate' may indicate a possible orientation (e.g. for mounting) of the optical microphone assembly. For example, 'substrate' may refer to a base portion while the 'superstate' may refer to a lid portion, such that the optical microphone assembly may be mounted via the substrate on a microphone support such as a printed circuit board (PCB). In embodiments with the aperture in the superstrate, the aperture would then be in the top of the optical microphone assembly. Such configurations are typically referred to as 'top port' arrangements. In embodiments with the aperture in the substrate, the aperture would then be in the bottom of the optical microphone assembly. Such configurations are typically referred to as 'bottom port' arrangements. In this context, 'top' and 'bottom' do not necessarily refer to an orientation with respect to the direction of gravity, but may refer respectively to the parts of the microphone farthest from and closest to a microphone support (e.g. PCB) on which the optical microphone assembly may be mounted.

The substrate may thus be configured to be mounted on a microphone support. For example, the substrate may be provided with solder pads, e.g. for mounting the substrate on a PCB.

Some or all of the substrate, superstrate and spacer may be integrally formed with one another. For example, the substrate and spacer may be an integrally-formed piece with a separate superstrate piece attached on top.

In a set of embodiments, the non-MEMS supporting structure comprises a substrate defining a recess surrounded by a wall; wherein the semiconductor chip is mounted in the recess and the MEMS component is mounted on top of the wall so as to span at least part of the recess; wherein the optical microphone assembly further comprises an enclosure mounted on the substrate or on top of the wall so that the enclosure and the substrate together define an acoustic cavity; and wherein the aperture is formed in the enclosure and the MEMS component is sealed to the enclosure such that the MEMS component closes the aperture. It should be appreciated that references herein to mounting on top of the wall are to be understood as mounting to an end face of the wall rather than mounting to the main face of the wall facing into the recess. No specific orientation is implied. In a set of embodiments, the non-MEMS supporting structure comprises a substrate defining a recess surrounded by a wall; wherein the aperture is formed in the substrate and the MEMS component is mounted in the recess to close the aperture; wherein the semiconductor chip is mounted on top of the wall so as to span at least part of the recess; and wherein the optical microphone assembly further comprises an enclosure mounted on the substrate or on the wall so that the enclosure and the substrate together define an acoustic cavity.

In the embodiments described above, the wall may be a peripheral wall (e.g. also forming an outer wall of the housing). In that case, the enclosure is mounted on the peripheral wall. The wall may be an interior wall. In that case, the enclosure is mounted on the substrate.

In embodiments comprising a recess surrounded by a wall, the substrate may be formed from a single piece such that the wall is an integrally formed part of the substrate. However, this is not essential, and in some embodiments, the wall and substrate are formed from separate pieces that are attached together. For example, the substrate may be formed from a base piece and a spacer mounted thereon such that the spacer defines the wall.

The semiconductor chip or the MEMS component may be mounted on top of the wall by any suitable means. For example, in some embodiments, the semiconductor chip is mounted on top of the wall by bump bonding (which is also known as flip-chip bonding).

In a set of embodiments, the MEMS component together with the semiconductor chip defines an optical microphone, and the optical microphone assembly comprises one or more further optical microphones on the non-MEMS supporting structure. Thus in such embodiments, a plurality of optical microphones may advantageously be provided on the same substrate or superstrate. Such arrangements may advantageously be used to provide, for example, arrays of microphones which provide the advantages of the invention, e.g. having an improved frequency response and increased ease of manufacturability.

When viewed from a second aspect the invention provides an optical microphone assembly comprising:
- a micro-electromechanical system (MEMS) component comprising an interferometric arrangement, the interferometric arrangement comprising a membrane and at least one optical element spaced from the membrane;
- a semiconductor chip comprising at least one photo detector and having mounted thereon a light source;
- a non-MEMS supporting structure; and
- an outer housing including at least part of the non-MEMS supporting structure, the outer housing defining an aperture;
- wherein the MEMS component is mounted on the non-MEMS supporting structure and sealed to the outer housing such that the MEMS component closes the aperture;
- wherein the semiconductor chip is mounted separately from the MEMS component on the non-MEMS supporting structure in a spaced relationship with the MEMS component such that the MEMS component is displaced relative to the semiconductor chip in a direction perpendicular to a reflecting surface of the membrane;

wherein the light source is arranged to provide light to the interferometric arrangement such that a first portion of said light propagates along a first optical path via said interferometric arrangement and a second portion of said light propagates along a second, different optical path via said interferometric arrangement such that at least one of said first and second portions is reflected by the reflecting surface of the membrane, thereby giving rise to an optical path difference between the first and second optical paths which depends on a distance between the membrane and the optical element; and wherein the at least one photo detector is arranged to detect at least part of an interference pattern generated by said first and second portions of light dependent on said optical path difference.

Optional features of the invention as discussed above with reference to the first aspect may also be features of the invention in accordance with the second aspect.

Certain preferred embodiments will now be described, by way of example only, with reference to the accompanying drawings, in which.

Figure 1A:
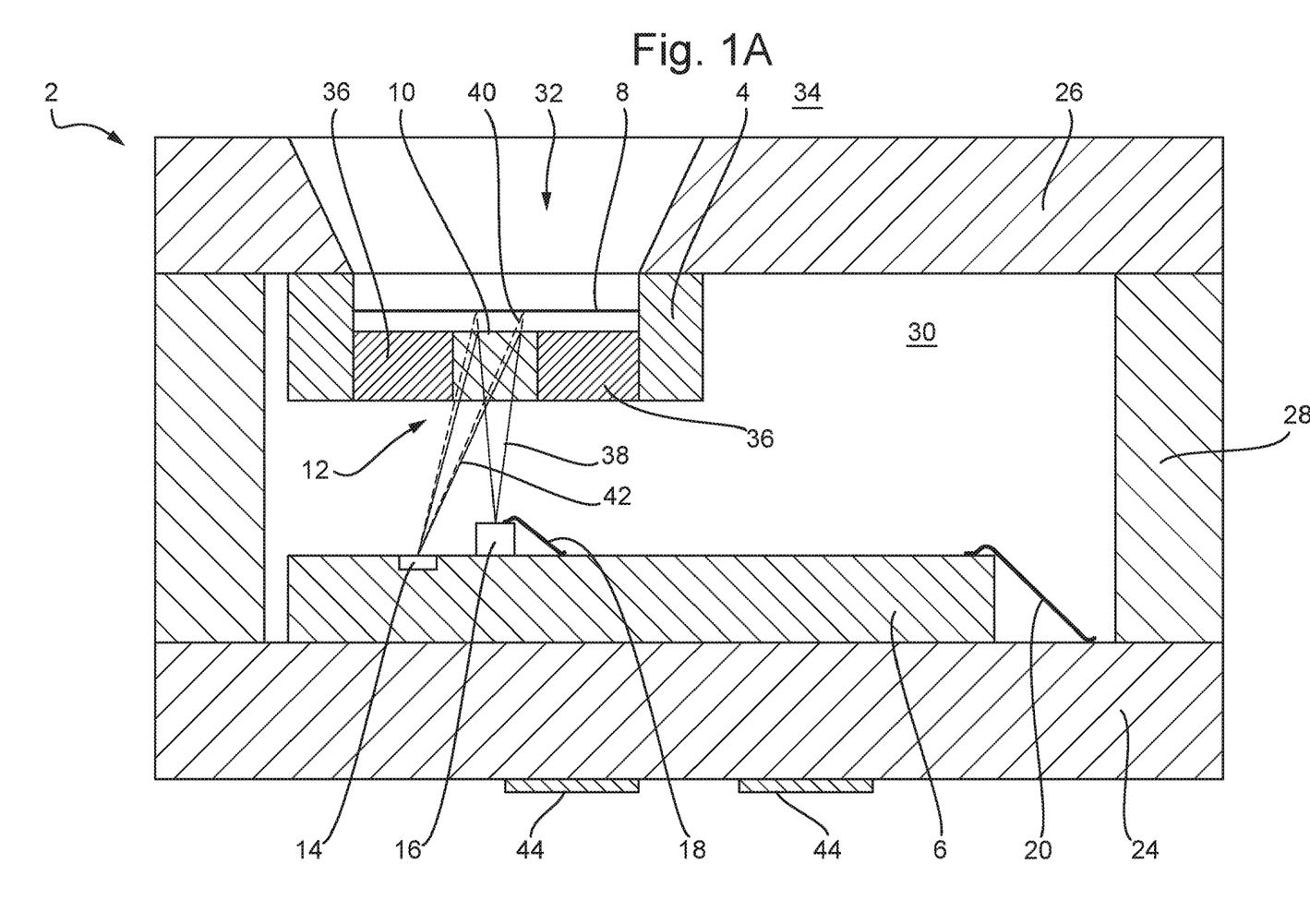
FIG. 1A shows a first embodiment of an optical microphone assembly in accordance with the present invention.

FIG. 1A shows an optical microphone assembly 2 in accordance with a first embodiment of the present invention. The optical microphone assembly comprises a number of internal components including a MEMS component 4 and a semiconductor chip 6. The MEMS component 4 comprises a membrane 8 and an optical element 10 provided on an optical element support 12. In this example, the optical element is a diffraction grating, but other optical elements may be used, e.g. diffractive lenses or plane reflecting surfaces.

The semiconductor chip 6 comprises a photo detector 14 and has mounted thereon a light source 16, which in this example embodiment is a vertical-cavity surface-emitting laser (VCSEL). The light source 16 could instead be integrated into the semiconductor chip 6. Connections 18 are provided between the VCSEL 16 and the semiconductor chip 6 to allow the VCSEL to be powered and controlled. Connections 20 are provided to allow the semiconductor chip to be powered and/or controlled by a remote power source and/or controller. While in this example embodiment, there is only a single photo detector, typically more than one photo detector may be provided, e.g. between 3 and 6 photo detectors. Multiple photo detectors may be provided, for example, to allow different diffraction patterns to be measured, or to allow more than one order of a diffraction pattern to be measured.

The optical microphone assembly 2 has a housing which encapsulates the aforementioned internal components and comprises a substrate 24 by means of which the optical microphone assembly is mounted on a microphone support, a superstrate 26, and a spacer 28, separating the substrate 24 from the superstrate 26. The substrate 24, superstrate 26 and spacer 28 are non-MEMS components and together define an acoustic cavity 30. The superstrate 26 has an aperture 32 formed therein, so that a first side of the membrane 8 is in fluid communication with the exterior 34 of the optical microphone assembly via the aperture 32. Air channels 36 are provided in the optical element support 12, so that a second side of the membrane 8 is in fluid communication with the acoustic cavity 30.

The substrate is provided with solder pads 44 to allow the optical microphone assembly to be mounted on a microphone support such as a PCB as mentioned above, and also to provide electrical connections between the optical microphone assembly and the PCB. The arrangement shown in FIG. 1A, wherein the aperture 32 is provided in a surface of the housing distal to the substrate 24 by which it is mounted to a microphone support, may be referred to as a "top port" configuration.

In use, acoustic waves propagating through the air at the exterior 34 of the optical microphone assembly propagate through the aperture 32 and impinge on the first side of the membrane 8. As the second side of the membrane 8 is in fluid communication only with the acoustic cavity 30, and not with the exterior of the microphone, the incoming acoustic wave causes a pressure differential, causing the membrane 8 to vibrate. The vibration of the membrane, and thus the incoming acoustic wave, is measured as described below.

When the optical microphone is operating, the light source 16 generates radiation 38, which is directed onto the optical element 10 (which in this example is a diffraction grating). Of the radiation that impinges on the diffraction grating, a first portion passes 40 through the diffraction grating and is diffracted. This diffracted radiation is then reflected by the membrane 8 onto the photo detector 14 via the diffraction grating. A second portion 42 is reflected by the diffraction grating onto the photo detector 14. The second portion 42 interferes with the first portion 40 to form an interference pattern, and consequently the intensity of light detected at the photo detector 14 depends on the interference pattern, and therefore on the distance between the optical element 10 and the membrane 8. As the intensity of the light at the detector 14 depends on the distance between the optical element 10 and the membrane 8, the position (and thus the motion) of the membrane 8 can be inferred from the detected intensities.

In this example, the optical microphone assembly has only one detector, which is positioned to receive the first order diffraction peak, however, this is not essential. The detector may be positioned to receive a different diffraction peak, e.g. a higher order diffraction peak. Multiple detectors could be used to detect more than one peak, e.g. the zeroth and first diffraction orders.

The movement of the membrane 8, measured as described above, corresponds to the pressure amplitude of the acoustic wave impinging on the microphone, because the acoustic wave exerts a force corresponding to its amplitude on the membrane, causing the membrane to be deflected. However, the Applicant has appreciated that in prior art optical microphone assemblies in which the membrane is disposed within a front volume acoustic cavity, the acoustic waveform of the incoming acoustic wave arriving at the optical microphone assembly is affected by the presence of the front volume acoustic cavity and the restricted air flow of a narrow acoustic port, particularly in the higher frequencies.

In contrast, it can be seen from FIG. 1A that in this embodiment, the MEMS component 4 is positioned to close the aperture 32 (rather than being positioned within a cavity accessible from the assembly exterior via an aperture), and the aperture has a diameter that is as large as the membrane diameter. Consequently, there is no substantially enclosed front volume, and air flow to the membrane is not restricted by a narrow aperture. The Applicant has found that this leads to a significantly improved frequency response. In optical microphone assemblies of the prior art, significant artefacts (e.g. peaks) are present in the frequency response in the high frequencies of the human hearing range (e.g. in the range 15 kHz to 20 kHz). In contrast, in embodiments of the invention, a substantially flat frequency response may be obtained in the range 20 Hz to 20 kHz.

In addition, it can be seen that the aperture 32 has a flared shape, such that its diameter near the exterior of the optical microphone assembly 2 (i.e. furthest from the membrane) is larger than its diameter near the interior of the optical microphone assembly 2 (i.e. closest to the membrane). The Applicant has found that this provides a further improvement in frequency response, as it reduces further the restriction of air flow into the aperture 32.

It can also be seen from FIG. 1A that the MEMS component 4 and the semiconductor chip 6 are mounted separately inside the housing. The MEMS component 4 is mounted on the superstrate 26, while the semiconductor chip 6 is mounted on the substrate 24. The Applicant has found that this provides a significant improvement in the ease of manufacture of the optical microphone assembly 2, in particular because it is easier to align the membrane 8 and the optical element 10 of the MEMS component with the light source 16 and the photo detector 14 so as to produce a suitable interference pattern at the photo detector 14. It will be appreciated from the present disclosure that there is no need to align the optical component 10 and the membrane 8 with the light source 16 and photo detector 14 as part of micro-fabrication techniques used to manufacture a MEMS component. Instead, this alignment depends on the position of the non-MEMS substrate 24, superstrate 26 and spacer 28, which are easier to align.

Figure 1B:
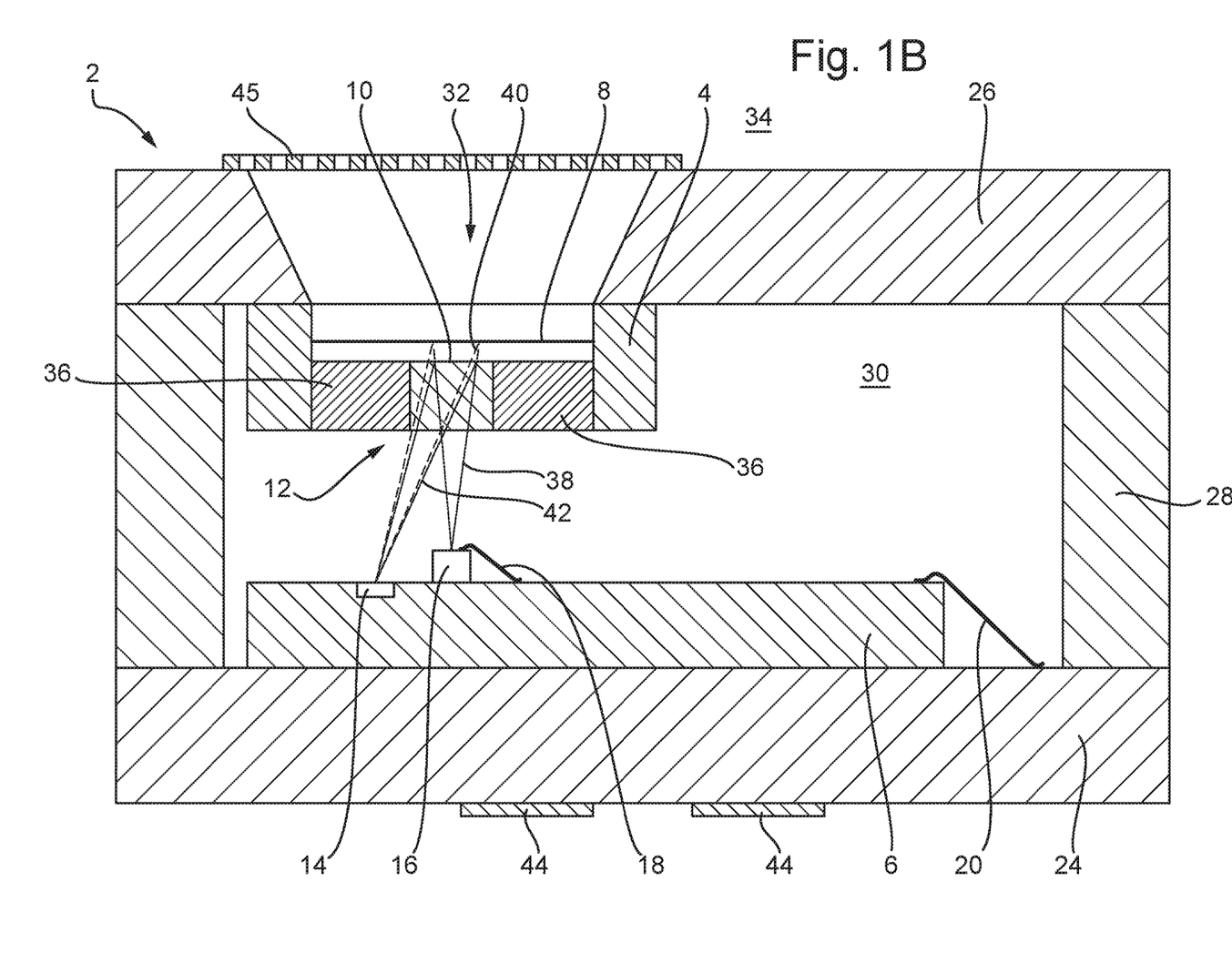
FIGS. 1B and 1C show variations on the embodiment of FIG. 1A, wherein the optical microphone assembly comprises a dust cover.

FIG. 1B shows the embodiment of FIG. 1A with a dust cover 45 provided over the aperture 32. The dust cover 45 comprises a porous sheet, i.e. comprising holes. The aggregate area of the holes is at least 50% of the area of the dust cover 45, which means that the dust cover 45 does not significantly impact the acoustic properties of the optical microphone assembly 2, and in particular, does not significantly impact the acoustic properties of the aperture 32. The dust cover 45 may therefore be described as substantially acoustically transparent.

The dust cover 45 helps to prevent accidental physical contact with the membrane 8 by objects exterior to the optical microphone assembly 2, and also helps to reduce leakage of light in or out of the optical microphone assembly 2 via the aperture 32.

Figure 1C:
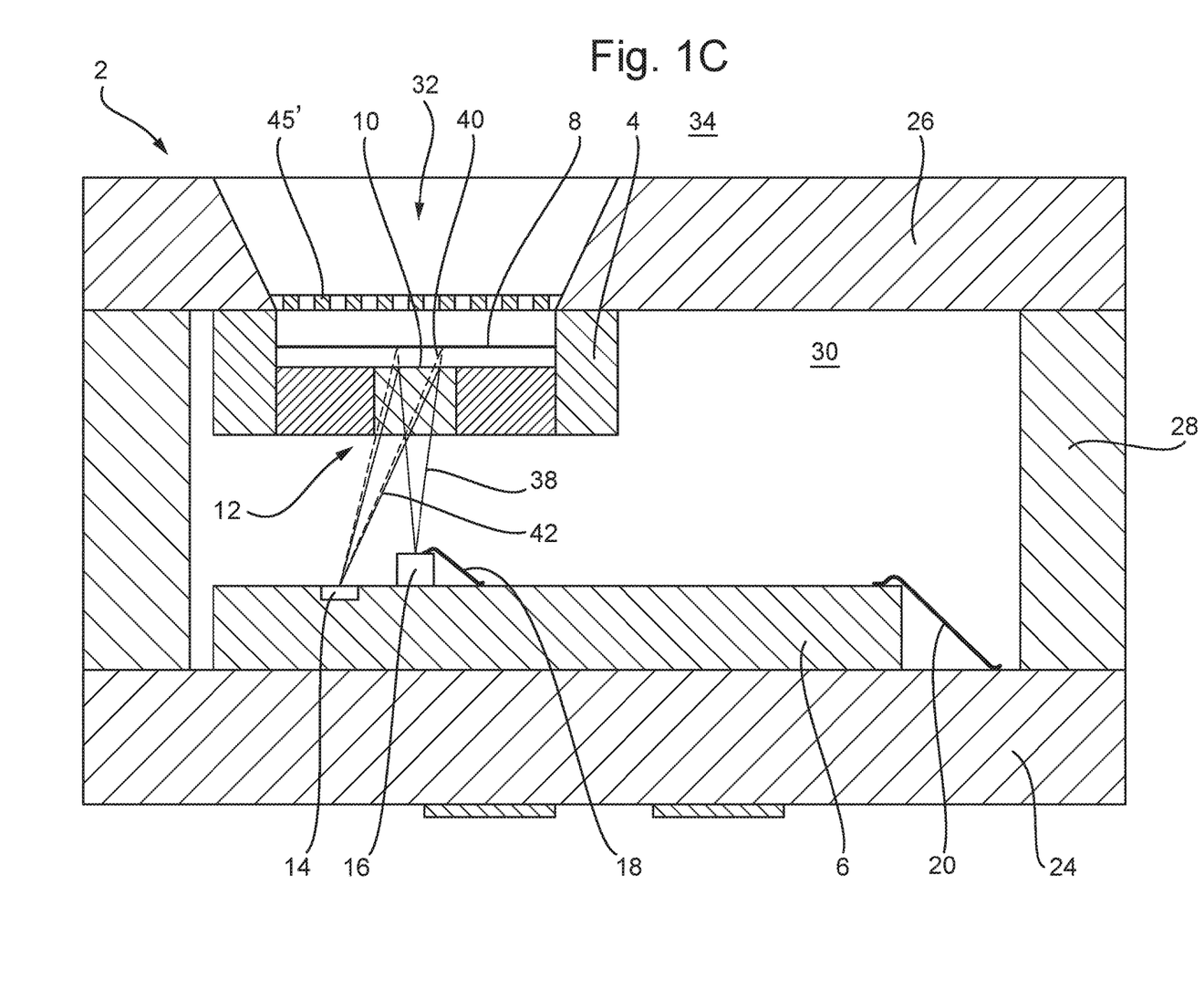

In FIG. 1B, the dust cover 45 is on the side of the aperture 32 facing the exterior of the optical microphone assembly 2. FIG. 1C shows a further variation on this embodiment, wherein the optical microphone assembly 2 comprises a dust cover 45' having the same physical and acoustic properties as the dust cover 45 of FIG. 1B. However, in FIG. 1C, the dust cover 45' is disposed on the side of the aperture 32 facing the membrane 8. A dust cover may optionally be provided in the other embodiments described below.

Figure 2:
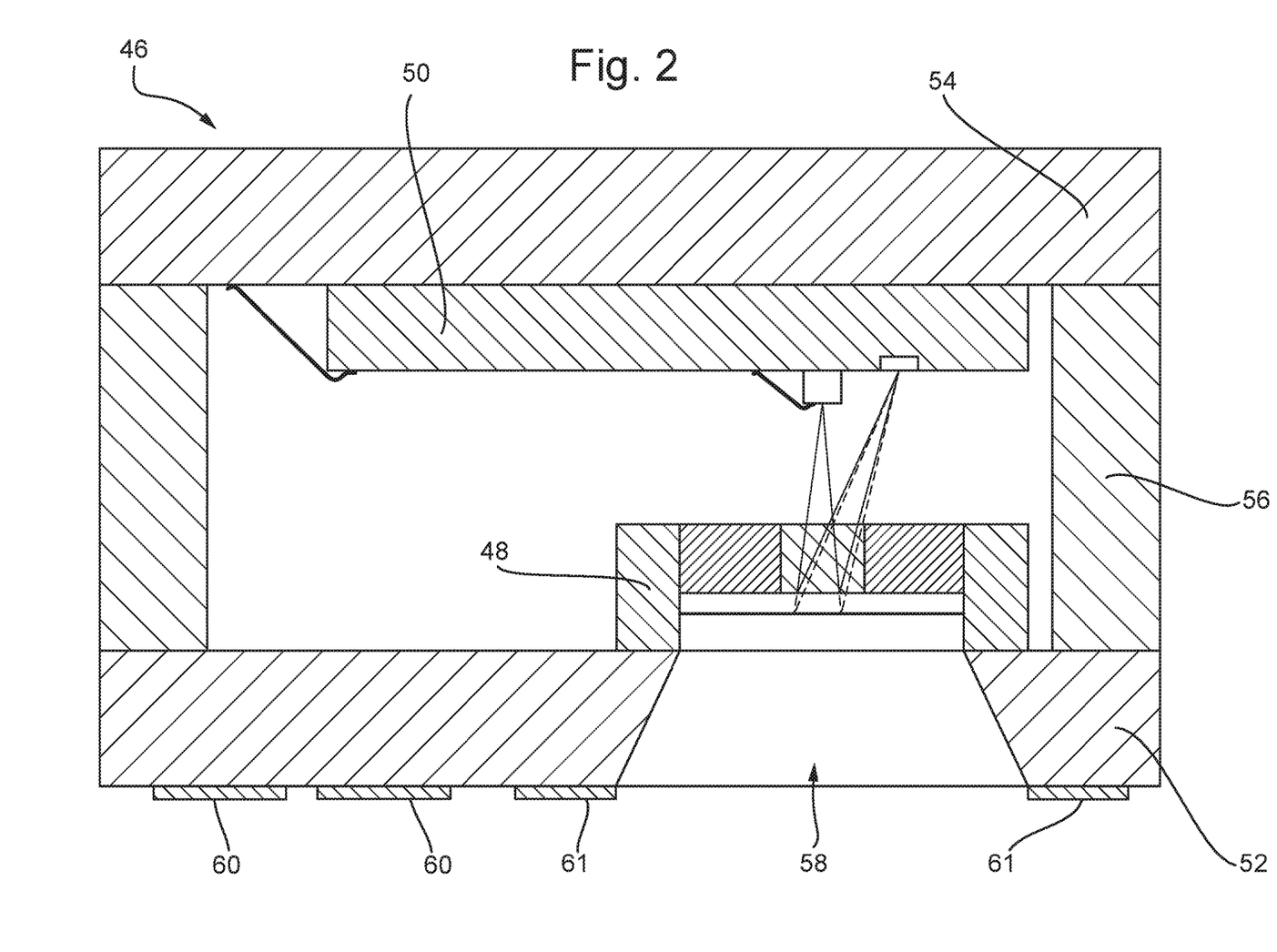
FIG. 2 shows a second embodiment of an optical microphone assembly in accordance with the present invention.

FIG. 2 shows an optical microphone assembly 46 according to a second embodiment of the present invention. The optical microphone assembly 46 comprises a MEMS component 48 and a semiconductor chip 50. The MEMS component 48 and the semiconductor chip 50 have the same structure and function as the MEMS component 4 and the semiconductor chip 6 respectively of the first embodiment.

In this embodiment, the optical microphone assembly 46 comprises a substrate 52 with solder pads 60 for mounting to a microphone support (e.g. a PCB), a superstrate 54, and a spacer 56. However, in contrast with the first embodiment, in the present embodiment, an aperture 58 is provided in the substrate 52 and not in the superstrate 54. A solder ring 61 surrounding the aperture is provided on the substrate for sealing the periphery of the aperture to the microphone support. The MEMS component 48 is sealed to the substrate 52 so as to close the aperture 58. The semiconductor chip 50 is mounted on the superstrate facing the MEMS component, and in alignment therewith, to generate an interference pattern corresponding to the membrane vibration in the same manner as described above with reference to the first embodiment.

It can be seen that the aperture 58 has a flared shaped with an inner diameter that is the same as the diameter of the membrane 59 of the MEMS component 48, and the MEMS component 48 is mounted on the substrate 52 so as to close the aperture 58. Accordingly, the optical microphone assembly 46 does not have a front volume acoustic cavity, and the airflow from the exterior of the microphone to the membrane 59 is substantially unrestricted by the aperture 58. This advantageously provides an improved frequency response of the optical microphone, as discussed above.

The arrangement shown in FIG. 2, wherein the aperture is provide in a surface of the housing proximal to a substrate for mounting to a microphone support, may be referred to as a "bottom port" configuration.

Figure 3:
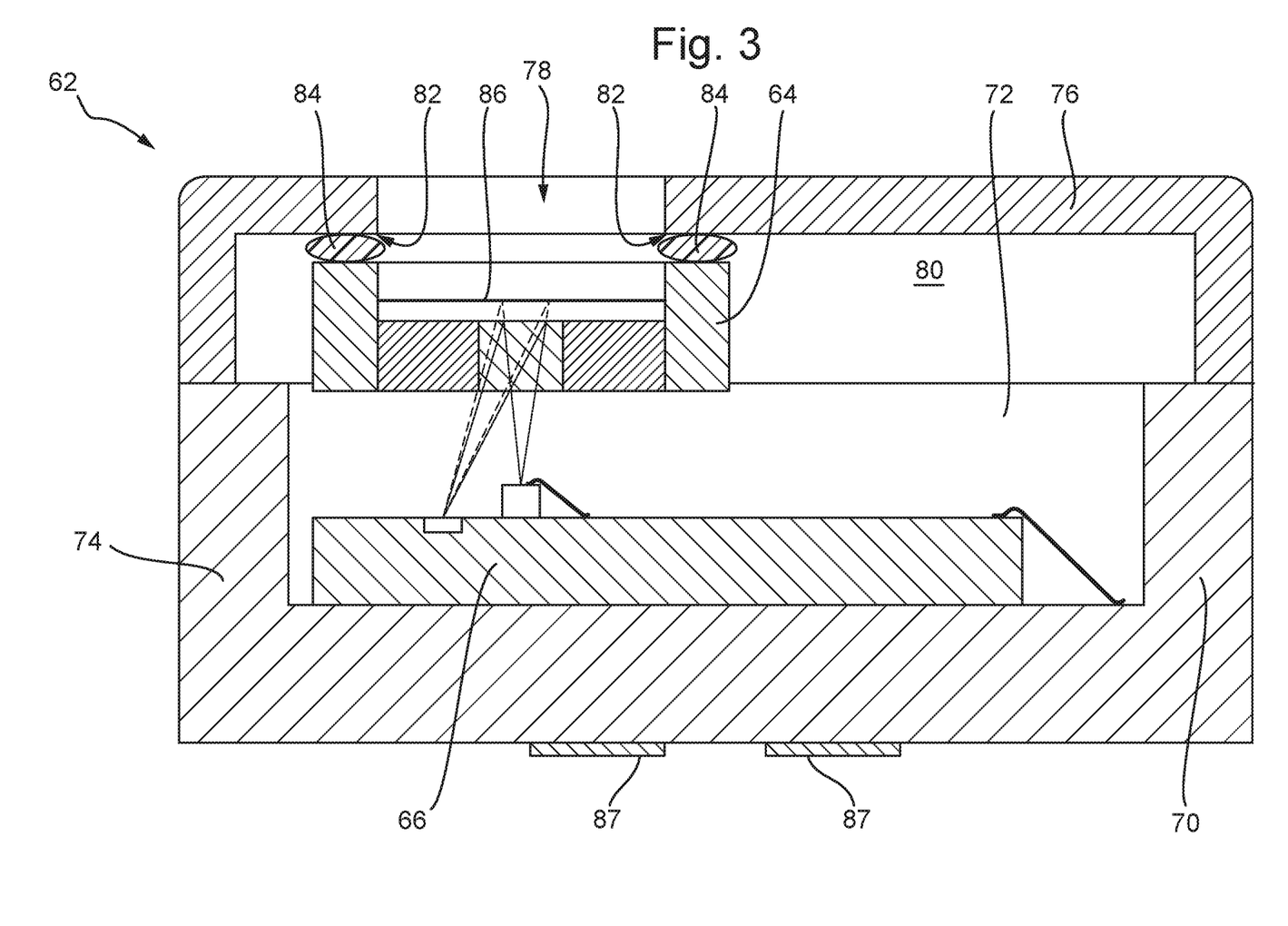
FIG. 3 shows a third embodiment of an optical microphone assembly in accordance with the present invention.

FIG. 3 shows an optical microphone assembly 62 according to a third embodiment of the present invention. The optical microphone assembly 62 comprises a MEMS component 64 and a semiconductor chip 66. The MEMS component 64 and the semiconductor chip 66 have equivalent structure and function to the MEMS components and semiconductor chips described above with reference to FIGS. 1 and 2.

Figure 4:
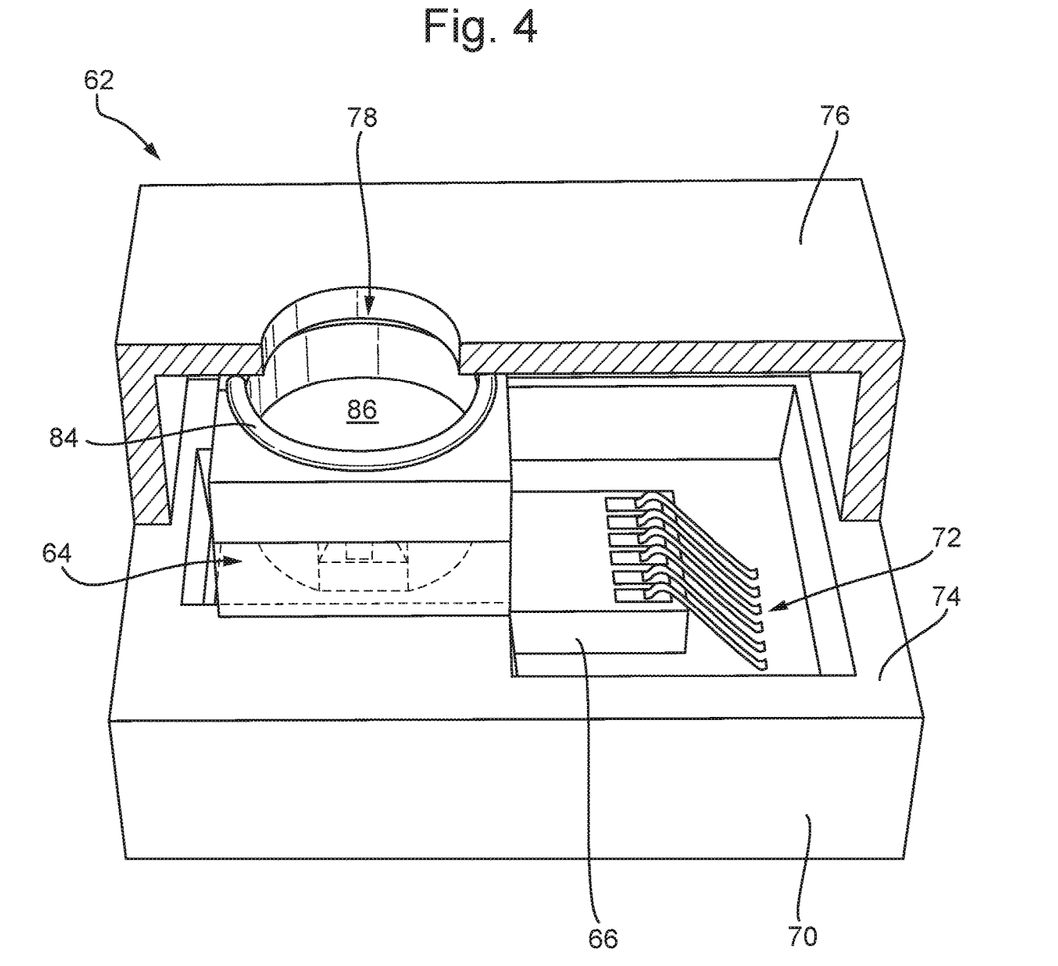
FIG. 4 shows a perspective view of the optical microphone assembly shown in FIG. 3.

The outer housing of the assembly comprises a substrate 70 which defines a recess 72 surrounded by a peripheral wall 74, and an enclosure 76. The semiconductor chip 66 is mounted in the recess 72 of the substrate. The MEMS component 64 is mounted on the top of the peripheral wall 74 such that it spans the recess 72. The mounting of the MEMS component 64 can be seen more clearly in the three-dimensional representation of the optical microphone assembly 62 which is shown in FIG. 4. It can be seen from FIG. 4 that the MEMS component has a width slightly greater than the recess 72 in the substrate 70, such that when it is placed on top of the substrate 70, it sits on top of the peripheral wall 74, such that it is supported by the peripheral wall 74 above and spaced from the semiconductor chip 66 in the recess 72.

Referring again to FIG. 3, the enclosure 76 has an aperture 78 formed therein. The enclosure is mounted on the peripheral wall 74 such that the enclosure 76 and the recessed substrate 70 together form an acoustic cavity 80. The aperture 78 is positioned so that it is above the MEMS component 64. The edges 82 of the aperture are sealed to the MEMS component 64 using stress free glue 84. This seals the acoustic cavity 80 from the exterior of the microphone so that acoustic waves arriving at the optical microphone assembly 62 impinge only on one side of the membrane 86 of the MEMS component 64, i.e. on the side that faces the aperture 78, and not the side of the membrane 86 that faces the acoustic cavity 80.

It can be seen that the aperture 78 has a diameter that is the same as the diameter of the membrane 86, and the MEMS component 64 is sealed to the enclosure 76 so as to close the aperture 78. Accordingly, the optical microphone assembly 62 does not have a front volume acoustic cavity, and the airflow from the exterior of the microphone to the membrane 86 is substantially unrestricted by the aperture 78. This advantageously provides an improved frequency response of the optical microphone, as discussed above.

In this example, the aperture 78 is not provided with a flared shape, although a flared aperture may be provided in variations on this and other embodiments.

In common with the earlier embodiments, the optical microphone assembly 62 is also provided with solder pads 87 on the substrate to allow the optical microphone assembly to be mounted on a microphone support such as a PCB. As with the first embodiment the arrangement shown in FIG. 3, wherein the aperture is provided in a surface of the housing distal to a substrate for attaching to a microphone support, is a "top port" configuration.

Figure 5:
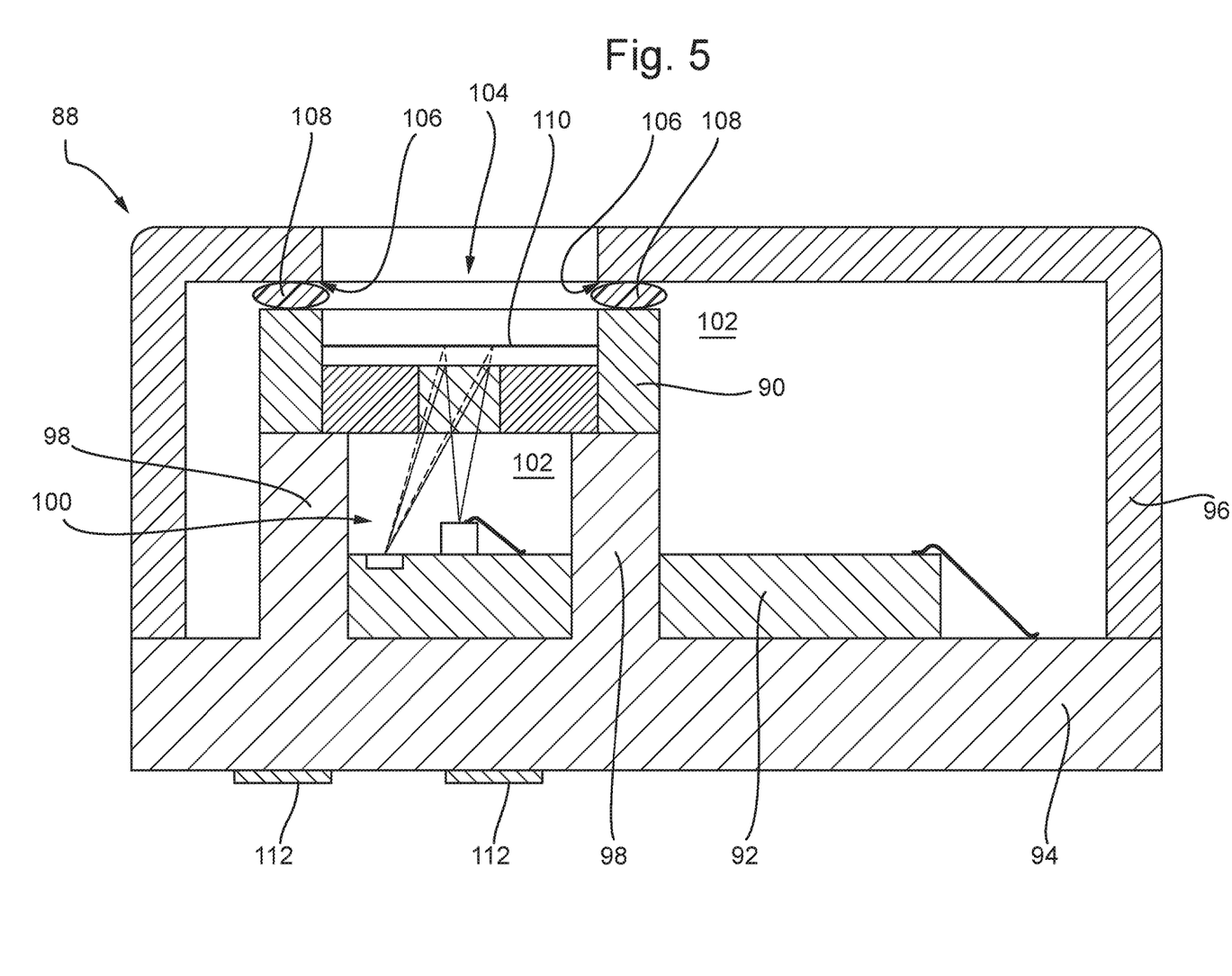
FIG. 5 shows a fourth embodiment of an optical microphone assembly in accordance with the present invention.

FIG. 5 shows an optical microphone assembly 88 which is a variation on the embodiment of FIGS. 3 and 4. The optical microphone assembly 88 comprises a MEMS component 90 and a semiconductor chip 92. The MEMS component 90 and the semiconductor chip 92 have the same structure and function as the MEMS component 64 and the semiconductor chip 66 respectively of the embodiment of FIGS. 3 and 4.

The embodiment of FIG. 5 comprises similar features to the embodiment of FIGS. 3 and 4, including a substrate 94 and an enclosure 96. However, this embodiment differs from the embodiment of FIGS. 3 and 4 in that the substrate 94 comprises an interior wall 98 defining a recess 100, instead of a peripheral wall. The MEMS component 90 is mounted on top of the interior wall 98 such that it spans the recess 100.

The enclosure 96 is mounted on the substrate 94 so that the enclosure 96 and the substrate 94 together define an acoustic cavity 102. The enclosure 96 has an aperture 104 formed therein, and the aperture 104 is positioned so that it is above the MEMS component 90. The edges 106 of the aperture are sealed to the MEMS component 90 using stress free glue 108. In a similar manner to that described with reference to FIG. 3, this seals the acoustic cavity 102 from the exterior of the microphone so that acoustic waves arriving at the optical microphone assembly 88 impinge only on one side of the membrane 110 of the MEMS component 90, i.e. on the side that faces the aperture 104, and not the side of the membrane 110 that faces the acoustic cavity 102.

The aperture 104 has a diameter that is the same as the diameter of the membrane 110, and the MEMS component 90 is sealed to the enclosure 96 so as to close the aperture 104. Accordingly, the optical microphone assembly 88 does not have a front volume acoustic cavity, and the airflow from the exterior of the microphone to the membrane 110 is substantially unrestricted by the aperture 104. This advantageously provides an improved frequency response of the optical microphone, as discussed above.

In common with the earlier embodiments, the optical microphone assembly 88 is also provided with solder pads 112 on the substrate to allow the optical microphone assembly to be mounted on a microphone support such as a PCB.

Figure 6:
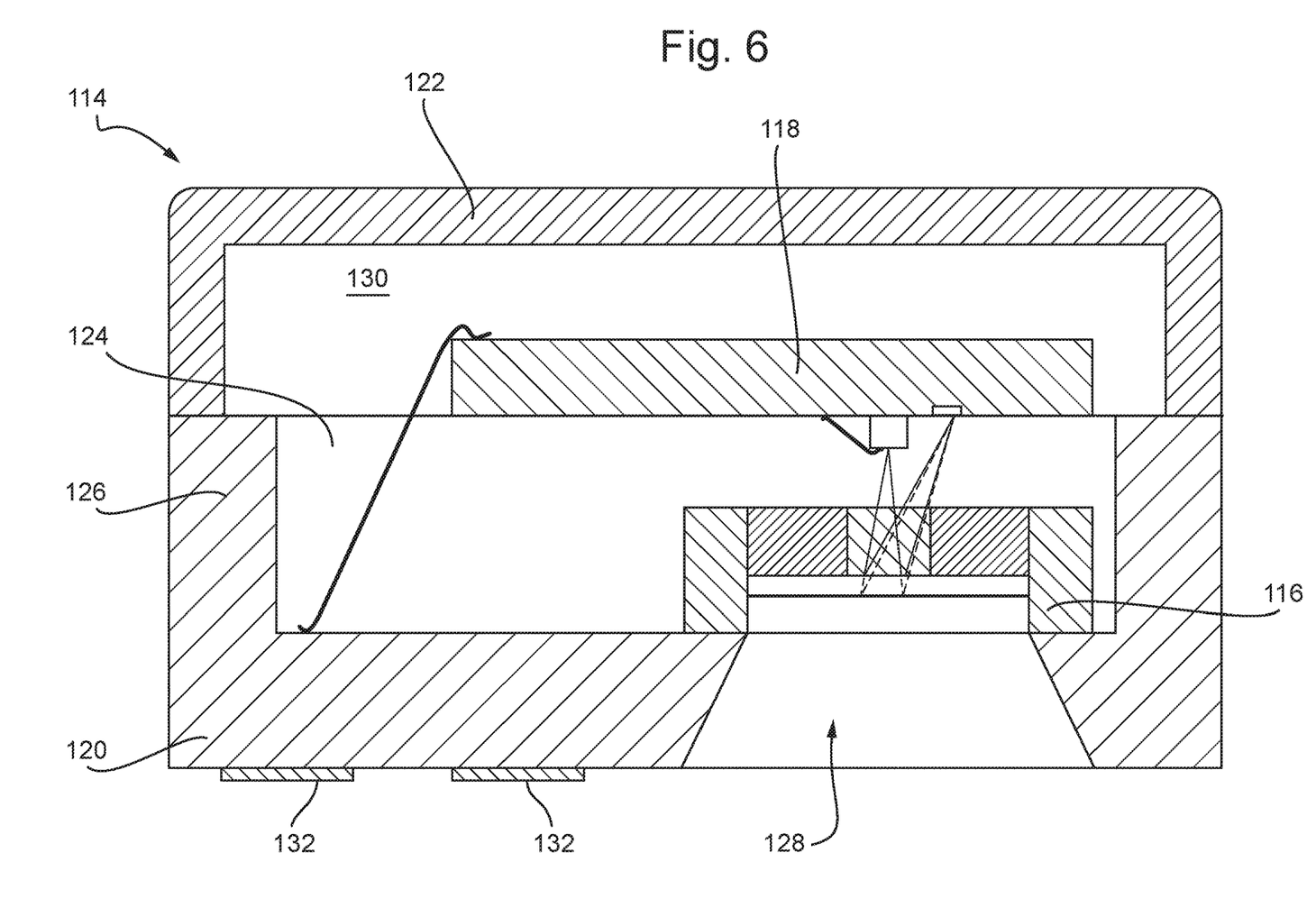
FIG. 6 shows a fifth embodiment of an optical microphone assembly in accordance with the present invention.

FIG. 6 shows a fifth embodiment of a bottom part optical microphone assembly 114 in accordance with the present invention. The optical microphone assembly comprises a MEMS component 116 and a semiconductor chip 118, which have equivalent structure and function to the MEMS components and semiconductor chips described in the embodiments above. Similarly to the embodiment of FIGS. 3 and 5, the optical microphone assembly 114 comprises a substrate 120 with solder pads 132 for mounting to a microphone support such as a PCB and an enclosure 122. The substrate 120 defines a recess 124 surrounded by a peripheral wall 126. An aperture 128 is formed in the bottom of the substrate 120.

The MEMS component 120 is mounted within the recess 124 so as to close the aperture 128. The semiconductor chip 118 is mounted on the peripheral wall 126 such that it spans the recess 124. The semiconductor chip faces the MEMS component 116 and is aligned therewith so that the MEMS component 116 and the semiconductor chip 118 together function as an optical microphone in the same manner described above with reference to the previous embodiments. The enclosure 114 is mounted on the top of the peripheral wall so as to form an acoustic cavity 130.

The aperture 128 has a flared shape, like the apertures 32, 58 of the first and second embodiments, which improves the frequency response of the optical microphone, as explained above.

Figure 7:
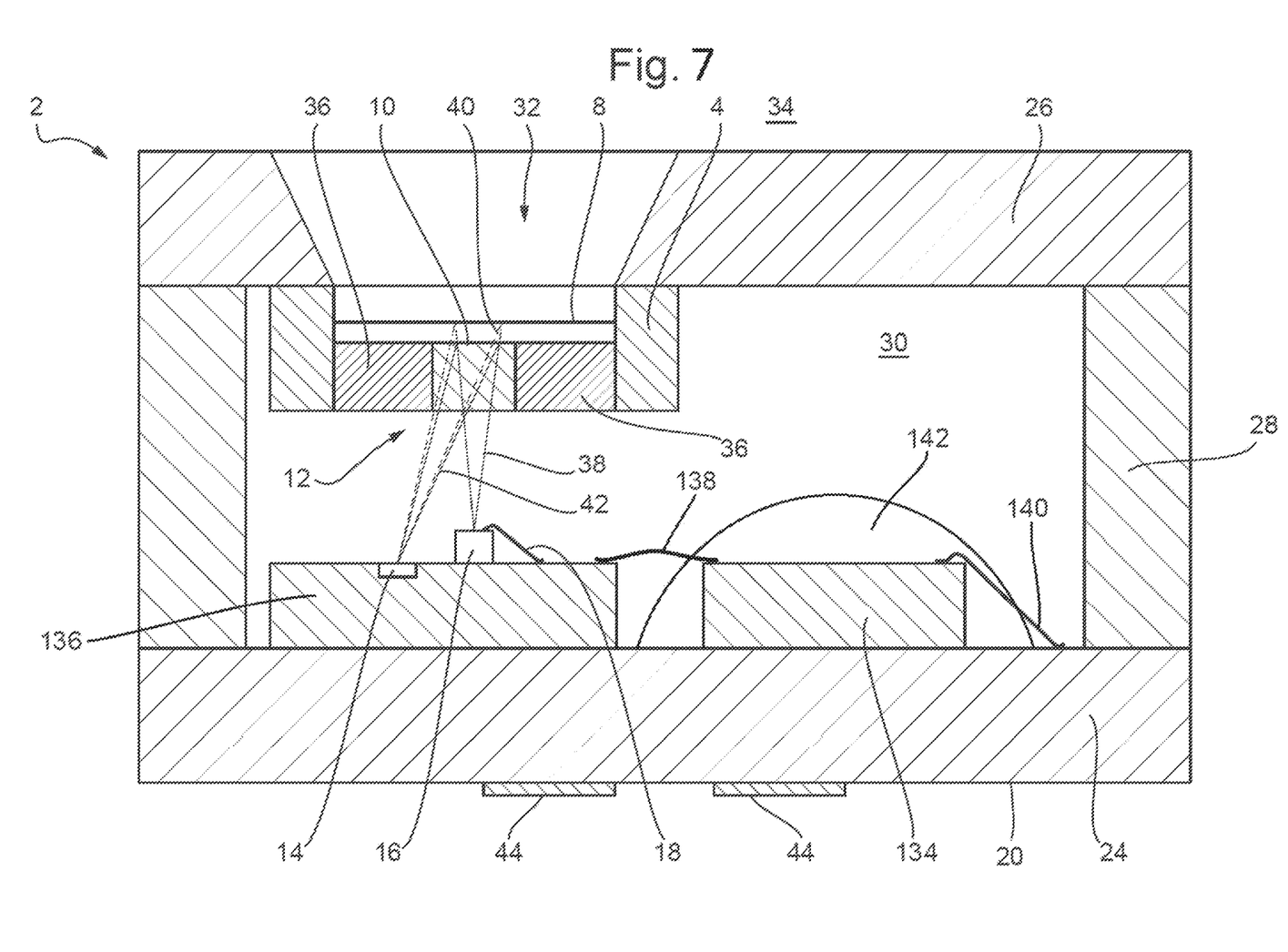
FIG. 7 shows a further variation on the embodiment of FIG. 1A.

FIG. 7 shows a variation on the embodiment of FIG. 1A, where corresponding features are denoted with like numerals. In this embodiment, an ASIC chip 134 is provided in addition to a semiconductor chip 136. Connections 138, 140 are provided between the semiconductor chip 136 and the ASIC chip 134 to allow control of the photo detector 14 and light source 16 by the ASIC chip 134, and between the ASIC chip 134 and the substrate 24 to allow connection to off-chip components, e.g. a power source. An opaque "globtop" covering 142 is provided over the ASIC chip 134. A separate ASIC chip could similarly be provided in variations on other embodiments, e.g. the other embodiments described above.

It will be appreciated that the above-described embodiments are examples only, and that other embodiments and variations are possible within the scope of the claims.

The invention claimed is:

1. An optical microphone assembly, comprising:
a micro-electromechanical system (MEMS) component comprising an interferometric arrangement, the interferometric arrangement comprising a membrane and at least one optical element spaced from the membrane;

a semiconductor chip comprising at least one photo detector;

a light source mounted on or integrated as part of the semiconductor chip;

a non-MEMS supporting structure; and an outer housing including at least part of the non-MEMS supporting structure, the outer housing defining an aperture;

wherein the MEMS component is mounted on the non-MEMS supporting structure and sealed to the outer housing with the interferometric arrangement positioned between the light source and the aperture such that the MEMS component closes the aperture and does not create an acoustic cavity between the aperture and a side of the membrane that is in fluid communication with an exterior of the optical microphone assembly;

wherein the semiconductor chip is mounted separately from the MEMS component on the non-MEMS supporting structure in a spaced relationship with the MEMS component such that the MEMS component has a displacement relative to the semiconductor chip in a direction perpendicular to a reflecting surface of the membrane;

wherein the light source is arranged to provide light to the interferometric arrangement such that a first portion of said light propagates along a first optical path via said interferometric arrangement and a second portion of said light propagates along a second, different optical path via said interferometric arrangement such that at least one of said first and second portions is reflected by the reflecting surface of the membrane, thereby giving rise to an optical path difference between the first and second optical paths which depends on a distance between the membrane and the optical element; and wherein the at least one photo detector is arranged to detect at least part of an interference pattern generated by said first and second portions of light dependent on said optical path difference.

2. The optical microphone assembly as claimed in claim 1, wherein the aperture has a width or diameter at least as large as a width or diameter of the membrane.

3. The optical microphone assembly as claimed in claim 1, wherein the width or diameter of the aperture is at least 500 μm.

4. The optical microphone assembly as claimed in claim 1, wherein the aperture is flared such that the aperture has an inner width or diameter adjacent an interior of the optical microphone assembly and an outer width or diameter adjacent the exterior of the optical microphone assembly, wherein the outer width or diameter is larger than the inner width or diameter.

5. The optical microphone assembly as claimed in claim 1, wherein the displacement of the MEMS component relative to the semiconductor chip in the direction perpendicular to the reflecting surface of the membrane is at least 250 μm.

6. The optical microphone assembly as claimed in claim 1, wherein the non-MEMS supporting structure comprises:
a substrate;
a superstrate having the aperture formed therein; and
a spacer separating the substrate and the superstrate;
wherein the MEMS component is mounted on the superstrate to close the aperture and the semiconductor chip is mounted on the substrate facing the MEMS component.

7. The optical microphone assembly as claimed in claim 1, wherein the non-MEMS supporting structure comprises:
a substrate having the aperture formed therein;
a superstrate; and
a spacer separating the substrate and the superstrate;
wherein the MEMS component is mounted on the substrate to close the aperture and the semiconductor chip is mounted on the superstrate facing the MEMS component.

8. The optical microphone assembly as claimed in claim 1,
wherein the non-MEMS supporting structure comprises a substrate defining a recess surrounded by a wall;
wherein the semiconductor chip is mounted in the recess and the MEMS component is mounted on top of the wall so as to span at least part of the recess;
wherein the optical microphone assembly further comprises an enclosure mounted on top of the wall so that the enclosure and the substrate together define an acoustic cavity; and
wherein the aperture is formed in the enclosure and the MEMS component is sealed to the enclosure such that the MEMS component closes the aperture.

9. The optical microphone assembly as claimed in claim 1,
wherein the non-MEMS supporting structure comprises a substrate defining a recess surrounded by a wall;
wherein the aperture is formed in the substrate and the MEMS component is mounted in the recess to close the aperture;
wherein the semiconductor chip is mounted on top of the wall so as to span at least part of the recess; and
wherein the optical microphone assembly further comprises an enclosure mounted on the substrate or on top of the wall so that the enclosure and the substrate together define an acoustic cavity.

10. The optical microphone assembly as claimed in claim 8 wherein the substrate is formed from a single piece such that the wall is an integrally formed part of the substrate.

11. The optical microphone assembly as claimed in claim 8 wherein the substrate is formed from a base piece and a spacer mounted thereon such that the spacer defines the wall.

12. The optical microphone assembly as claimed in claim 8, wherein the semiconductor chip is mounted on top of the wall by bump bonding.

13. The optical microphone assembly as claimed in claim 1, wherein the aperture is provided with a dust cover.

14. The optical microphone assembly as claimed in claim 1, wherein the MEMS component together with the semiconductor chip defines an optical microphone, and wherein the optical microphone assembly comprises one or more further optical microphones on the non-MEMS supporting structure.

15. The optical microphone assembly as claimed in claim 9, wherein the substrate is formed from a single piece such that the wall is an integrally formed part of the substrate.

16. The optical microphone assembly as claimed in claim 9, wherein the substrate is formed from a base piece and a spacer mounted thereon such that the spacer defines the wall.

17. A method of manufacturing an optical microphone assembly, wherein the optical microphone assembly comprises:
a micro-electromechanical system (MEMS) component comprising an interferometric arrangement, the interferometric arrangement comprising a membrane and at least one optical element spaced from the membrane;
a semiconductor chip comprising at least one photo detector;

a light source mounted on or integrated as part of the semiconductor chip;

a non-MEMS supporting structure; and an outer housing including at least part of the non-MEMS supporting structure, the outer housing defining an aperture;

the method comprising:

mounting the MEMS component on the non-MEMS supporting structure such that the MEMS component is sealed to the outer housing with the interferometric arrangement positioned between the light source and the aperture the MEMS component closes the aperture and does not create an acoustic cavity between the aperture and a side of the membrane that is in fluid communication with an exterior of the optical microphone assembly; and mounting the semiconductor chip separately from the MEMS component on the non-MEMS supporting structure in a spaced relationship with the MEMS component such that the MEMS component has a displacement relative to the semiconductor chip in a direction perpendicular to a reflecting surface of the membrane; and wherein mounting the semiconductor chip comprises positioning the semiconductor chip such that the light source is arranged to provide light to the interferometric arrangement such that a first portion of said light propagates along a first optical path via said interferometric arrangement and a second portion of said light propagates along a second, different optical path via said interferometric arrangement such that at least one of said first and second portions is reflected by the reflecting surface of the membrane, thereby giving rise to an optical path difference between the first and second optical paths which depends on a distance between the membrane and the optical element; and such that the at least one photo detector is arranged to detect at least part of an interference pattern generated by said first and second portions of light dependent on said optical path difference.

* * * * *